United States Patent [19]
Kaczkowski

[11] 4,033,791
[45] July 5, 1977

[54] MAGNETOSTRICTIVE ALLOY

[75] Inventor: Zbigniew Kaczkowski, Warsaw, Poland

[73] Assignee: Polska Akademia Nauk, Instytut Fizyki, Warsaw, Poland

[22] Filed: Jan. 6, 1976

[21] Appl. No.: 646,932

[30] Foreign Application Priority Data

Jan. 22, 1975 Poland .............................. 177485

[52] U.S. Cl. .............................. 148/31.55; 75/124; 148/100
[51] Int. Cl.² .................. C04B 35/00; C22C 38/06
[58] Field of Search .................. 75/124, 123 K; 148/31.55, 31.57, 100

[56] References Cited

UNITED STATES PATENTS

| | | | |
|---|---|---|---|
| 2,027,996 | 1/1936 | Mishima ............................. | 75/124 |
| 2,300,336 | 10/1942 | Bozorth et al. ................. | 148/31.55 |
| 2,859,143 | 11/1958 | Nachman et al. ................. | 75/124 |

OTHER PUBLICATIONS

Bozorth, R.; *Ferromagnetism*; New York, 1951 pp. 595–596, 610–612, 620–621, and 626–629.

*Primary Examiner*—Walter R. Satterfield
*Attorney, Agent, or Firm*—Eric P. Schellin; H. Karl Saalbach

[57] ABSTRACT

The subject of the invention is an alloy of magnetostrictive and piezomagnetic properties suitable for the production of cores of ultrasonic transducers. The alloy according to the invention contains, besides iron, 5 to 15% Al, 0.5 to 10% Co and up to 3% of other additives.

6 Claims, No Drawings

MAGNETOSTRICTIVE ALLOY

The subject of the present invention is an alloy of magnetostrictive and piezomagnetic properties designed for the production of ultrasonic transducer cores.

Metallic materials hitherto commonly used for the production of the magnetostrictive transducer cores are pure nickel and either cobalt-iron alloys containing 48 to 64% Co (permendur) or nickel-iron alloys containing 45 to 50% Ni (permalloy).

Basic physical and piezomagnetic properties of these known materials are shown in the table below.

| Quantity | Symbol | Unit | Ni 100% | Co + Fe 50% Co permendur | Ni + Fe 45% Ni permalloy |
|---|---|---|---|---|---|
| Saturation induction | $B_s$ | T | 0.6 | 2.4 | 1.6 |
| Saturation magnetostriction | $\lambda_s$ | $10^{-6}$ | −30 | 65 | 25 |
| Curie temperature | $T_c$ | °C | 358 | 980 | 440 |
| Resistivity | $\rho_c$ | $\mu\Omega$ cm | 7 | 7 | 45 |
| Specific gravity | $\gamma$ | g/cm$^3$ | 8.7 | 8.3 | 8.2 |
| Youngs modulus | E | $10^{12}$ dyn/cm$^2$ | 2.0 | — | 1.6 |
| Coefficient of magnetomechanical coupling | $k_m$ | — | 0.25 | 0.3 | 0.3 |
| Dynamic magnetic permeability at maximum | $\mu\, k_m$ | — | 70 | 160 | 100 |

These commonly used alloys contain, however, a high percentage of such costly element as nickel and cobalt and are therefore too expensive for mass production of cores.

The invented new iron-based alloy, though having desired magnetostrictive and piezomagnetic properties, requires much lower content of expensive metals.

It has been found that a properly composed alloy should contain, besides iron, 5 to 15% aluminium, 0.5 to 10% cobalt and 3% of other possible additives.

Used as additives can be such metals as: manganese, chromium, copper, nickel, tungsten and molybdenum. The addition of these elements causes no considerable increase in price of the alloy made according to the present invention, since in average they cost less than nickel.

Piezomagnetic and other physical properties of the alloy according to this invention are better than these of the known alloys.

An alloy containing a dozen or so percent of Al and several percent of Co has a magnetomechanical coupling factor $k_m$ ranging from 0.32 to 0.38 while an alloy containing the same amount of Al and no Co has a $k_m$ of 0.19. The remaining parameters do not differ from the parameters of known alloys.

EXAMPLE 1

Alloy according to invention containing:
aluminium — 12%
cobalt — 2%
iron — 86%
has a magnetomechanical coupling factor $k_m$ of 0.38.

EXAMPLE 2

Alloy according to invention containing:
aluminium — 12%
cobalt — 1%
iron — 87%
has a $k_m$ of 0.37

EXAMPLE 3

Alloy according to invention containing
aluminium — 12%
cobalt — 1%
manganese — 1%
iron — 86%
has a $k_m$ of 0.32

EXAMPLE 4

Alloy according to invention containing:
aluminium — 12%
cobalt — 1%
molybdenum — 1%
iron — 86%
has a $k_m$ of 0.35

I claim:

1. A processed alloy having magnetostrictive properties and suitable for the production of magnetostrictive cores for magnetostrictive ultrasonic transducers, said alloy consisting essentially of iron as a major ingredient and 5 to 15% aluminum and 0.5 to 10% cobalt as additive ingredients, said alloy being further characterized by having a value of $k_m$ between 0.32 and 0.38.

2. The alloy of claim 1 in which the content of iron, aluminum and cobalt is substantially 86, 12 and 2%, respectively, and having a $k_m$ of substantially 0.38.

3. The alloy of claim 1 in which the content of iron, aluminum and cobalt is substantially 87, 12 and 1%, respectively, and having a $k_m$ of substantially 0.37.

4. The alloy of claim 1 including, as an additional additive ingredient, up to 3% of a metal selected from the group consisting of manganese, chromium, copper, nickel, tungsten and molybdenum.

5. The alloy of claim 4 in which the content of iron, aluminum, cobalt and manganese is substantially 86, 12, 1% and 1%, respectively, and having a $k_m$ of substantially 0.32.

6. The alloy of claim 4 in which the content of iron, aluminum, cobalt and molybdenum is substantially 86, 12, 1% and 1%, respectively, and having a $k_m$ of substantially 0.35.

* * * * *